United States Patent [19]
Xu et al.

[11] Patent Number: 6,133,692
[45] Date of Patent: Oct. 17, 2000

[54] WHITE LIGHT GENERATING ORGANIC ELECTROLUMINESCENT DEVICE AND METHOD OF FABRICATION

[75] Inventors: Ji-Hai Xu, Gilbert; Thomas B. Harvey, III, Scottsdale, both of Ariz.

[73] Assignee: Motorola, Inc., Schaumburg, Ill.

[21] Appl. No.: 09/093,080

[22] Filed: Jun. 8, 1998

[51] Int. Cl.[7] .............................. H01J 1/62; H01J 63/04
[52] U.S. Cl. ............................ 313/506; 313/504; 257/40
[58] Field of Search ................................ 313/506, 503, 313/509, 504, 461, 466, 463; 257/40, 98, 99; 428/690

[56] References Cited

U.S. PATENT DOCUMENTS

| | | | |
|---|---|---|---|
| 5,674,636 | 10/1997 | Dodabalapur et al. | 313/504 |
| 5,920,080 | 7/1999 | Jones | 313/509 |
| 5,990,996 | 11/1999 | Sharp | 349/119 |

*Primary Examiner*—Michael H. Day
*Assistant Examiner*—Joseph Williams
*Attorney, Agent, or Firm*—Eugene A. Parsons; William E. Koch

[57] ABSTRACT

A white light generating organic electroluminescent device including an organic light emitting diode emitting a broad spectrum light including a component of each primary color. A multi-mode microcavity structure is positioned to cooperate with the diode defining an optical length of the microcavity structure to enhance the broad spectrum light and obtain multiple resonant peaks, one at each primary color. A plurality of filters are positioned to receive and adjust the multiple resonant peaks to provide substantially balanced multiple resonant peaks.

12 Claims, 2 Drawing Sheets

WHITE LIGHT GENERATING ORGANIC ELECTROLUMINESCENT DEVICE AND METHOD OF FABRICATION

FIELD OF THE INVENTION

The present invention pertains to organic electroluminescent devices and more specifically to OEDs for generating white light.

BACKGROUND OF THE INVENTION

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices, such as portable electronic devices.

Organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

In spite of all the advantages of OEDs there are still some draw backs to their use. One of the drawbacks in the use of OEDs in displays is the generation of the colors necessary to achieve a full color display. Red, green and blue OEDs can be fabricated but they require different organic materials and, thus, each color must be fabricated separately. Furthermore, the colors achieved are not a pure primary color, but have a relatively broad spectrum. Some OEDs even include a spectrum containing quantities of each primary color, but the intensities are substantially different, e.g. the green is generally stronger than the blue or red. Green, blue, red, and white OEDs have been experimentally demonstrated and, except for green, the red, blue and white devices still show low luminous efficiency and poor reliability. Typically, because of the poor performance of blue, red, and white, devices, these devices are not good enough to provide a RGB display with a reasonable performance. There still exists problems associated with generating the three primary colors in a single device.

Accordingly, it is highly desirable to provide an organic electroluminescent device for generating substantially white light.

It is a purpose of the present invention to provide a new and improved white light organic electroluminescent device for generating white light with improved uniformity of primary color components.

It is a further purpose of the present invention to provide a white light generating organic electroluminescent device with improved efficiency and reliability.

SUMMARY OF THE INVENTION

The above problems and others are at least partially solved and the above purposes and others are realized in a white light generating organic electroluminescent device including an organic light emitting diode having a diode output for emitting a broad spectrum light including a component of each primary color. A multi-mode microcavity structure is positioned to receive the broad spectrum light from the diode output and to cooperate with the organic light emitting diode defining an optical length of the microcavity structure to enhance the broad spectrum light and obtain multiple resonant peaks, one at each primary color, at a cavity output of the multi-mode microcavity structure. A plurality of filters are positioned adjacent the cavity output to receive and adjust the multiple resonant peaks to provide substantially balanced multiple resonant peaks.

BRIEF DESCRIPTION OF THE DRAWING

Referring to the drawings.

DESCRIPTION OF THE PREFERRED EMBODIMENTS

Figure 1:
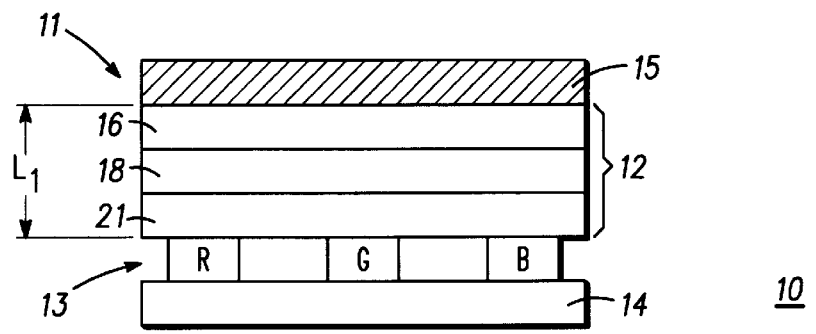
FIG. 1 is an enlarged and simplified sectional view of a white light generating organic electroluminescent device in accordance with the present invention.

Turning now to the figures, FIG. 1 is an enlarged and simplified sectional view of a white light generating organic electroluminescent device 10 in accordance with the present invention. White light generating organic electroluminescent device 10 includes a light emitting diode, generally designated 11, a multi-mode microcavity 12, and a filter system 13 carried by a transparent substrate 14, such as glass, plastic, or the like. Multi-mode microcavity 12 is positioned in alignment with the light output from diode 11 to enhance the light spectrum.

In this embodiment, light emitting diode 11 includes an organic light emitting diode with an upper metal electrical contact 15, at least one organic light emissive layer 16 and a lower electrical contact 18. Upper electrical contact 15 essentially forms a reflective surface to reflect all light generated within diode 11 downwardly. Lower electrical contact 18 is formed of some electrically conductive material which is transparent to light generated in diode 11, such as indium-tin-oxide (ITO) or the like and defines the diode output for device 10. Organic light emissive layer (or layers) 16 defines an organic light emitting zone emitting light in response to the recombination of holes and electrons therein.

Figure 2:
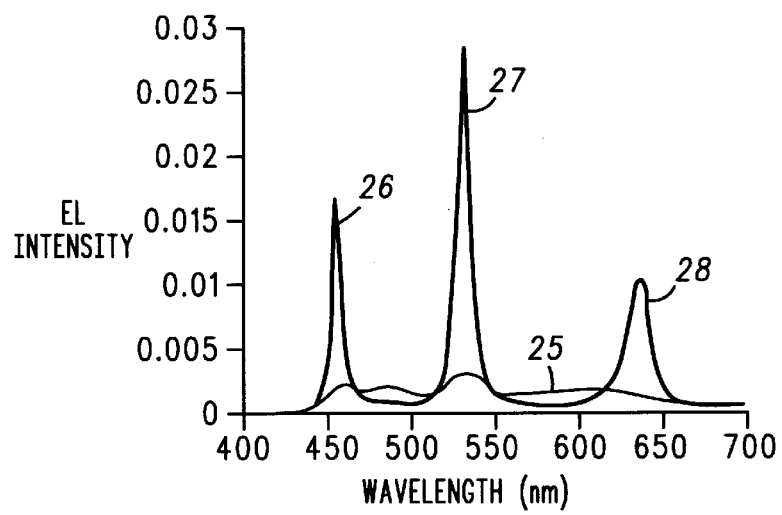
FIG. 2 illustrates EL spectrums for the light in various portions of the device of FIG. 1.

The light emitted is a broad spectrum light including a component of each primary color an example of which is illustrated by curve 25 with reference to FIG. 2. While a specific curve is shown, those skilled in the art will recognize that any spectrum which contains a component of each primary color (red, green, blue) can be utilized. It will of course be understood that diode 11 can include from one organic layer to several (e.g. electron injecting and/or transporting, hole injecting and/or transporting, etc.) depending upon the material utilized.

Multi-mode microcavity 12 is illustrated in FIG. 1 as including diode 11 and a mirror stack 21. Mirror stack 21 includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, mirror stack 21 is formed of alternate layers of $TiO_2$ and $SiO_2$. Generally, from 2 to 4 pairs of layers provides a reflectivity of approximately 0.74, which is believed to be optimal for the present purpose. As is understood by those skilled in the art, each pair of layers of mirror stack 21 defines a partial mirror with an operating thickness of an integer multiple of one half wavelength of the emitted light so that all reflected light is in phase.

The thickness of organic light emissive layer 16 and lower contact 18 is designed to position mirror stack 21 in spaced relationship from reflective upper contact 15 and define an optical length LI of multi-mode microcavity 12 in cooperation with diode 11. Stack 21 further defines a microcavity output for multi-mode microcavity 12. Multimode microcavity 12 is positioned to receive the broad spectrum light from diode 11 and to cooperate with diode 11 to define an optical length of multi-mode microcavity 12 which enhances the broad spectrum light to obtain multiple resonant peaks 26, 27 and 28, illustrated in FIG. 2. Multiple resonant peaks 26, 27 and 28 are each located at one of the primary colors. The enhanced broad spectrum light is produced at a cavity output of multi-mode microcavity 12.

A plurality of filters 13 are positioned adjacent the cavity output to receive and adjust multiple resonant peaks 26, 27 and 28. Plurality of filters 13 include a filter for each primary color to provide substantially balanced multiple resonant peaks. Depending on the components of the primary colors contained within the broad spectrum light generated by diode 11, the enhancement of the broad spectrum light to form multiple resonant peaks 26, 27 and 28 may result in peaks of varying intensity. Filters 13 adjust the balance of multiple resonant peaks 26, 27 and 28 to obtain substantially white light.

Figure 3:
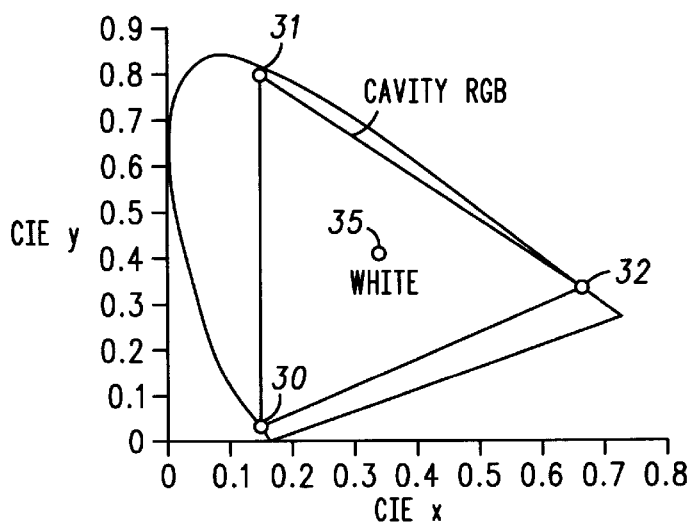
FIG. 3 is a CIE diagram illustrating the CIE coordinates of the light generated by the device of FIG. 1.

Referring now to FIG. 3, a CIE diagram is provided, illustrating points 30, 31 and 32 representative of peaks 26, 27 and 28, respectively. As is known in the art, the combination of light or colors represented by points 30, 31 and 32 results in white light represented by point 35. In a specific example, by employing multi-mode microcavity 12, with an effective optical length of L1=1590 nm, the broad spectrum light generated by diode 11 will be enhanced to produce peaks 26, 27 and 28 at 454 nm (blue), 530 nm (green) and 636 nm (red). These will in turn be balanced by filters 13 to produce substantially true white light represented by point 35.

Figure 4:
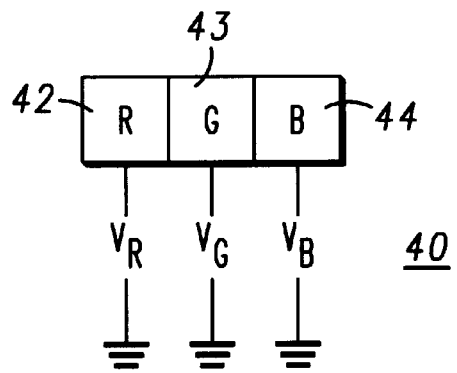
FIG. 4 illustrates a filter system for the device of FIG. 1.

Referring to FIG. 4, a filter system 40 including active filters 42, 43 and 44 is illustrated. It will be understood that filter system 40 is an embodiment of a filter system which can be utilized as plurality of filters 13 in device 10 of FIG. 1. Each active filter 42, 43 and 44 is known in the art and will not be described in detail herein other than to specify that voltages Vr, Vg and Vb applied thereto respectively, control the filtering action. By varying the voltage applied to each of filters 42, 43 and 44 resonant peaks 26, 27 and 28 can be balanced to achieve substantially true white light or variations thereof as desired.

Figure 5:
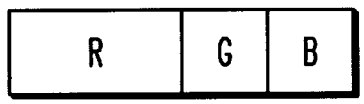
FIG. 5–7 illustrate other embodiments of a filter system for the device of FIG. 1.
Figure 6:
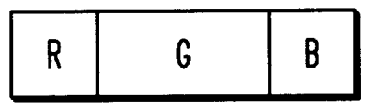
Figure 7:
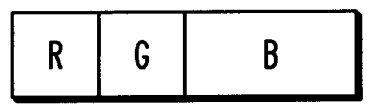

Referring to FIGS. 5–7, different embodiments are illustrated wherein passive filters are utilized in the filter system. In each of FIGS. 5–7, areas designated R, G, and B represent passive filters that allow passage of red, green and blue light respectively. In the passive system, the balance of peaks 26, 27, and 28 is achieved by adjusting the area of each individual passive filter. For example, in FIG. 5, the area representing the B filter is increased, thereby permitting passage of a greater amount of blue light than red or green light. In FIG. 6, the area representing the G filter is increased, thereby permitting passage of a greater amount of green light than red or blue light. In FIG. 7, the area representing the R filter is increased, thereby permitting passage of a greater amount of red light than blue or green light. By varying the area of each of the filters R, G, and B, resonant peaks 26, 27 and 28 can be balanced to achieve substantially true white light or variations thereof as desired.

Therefore an organic electroluminescent device has been provided for generating substantially white light with an improved balance of primary color components. By enhancing and balancing the primary color components, a white light generating organic electroluminescent device is provided with improved efficiency and reliability. Driving currents to the diode can be reduced while still achieving sufficient light, thereby increasing longevity and reducing power consumption.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A white light generating organic electroluminescent device comprising:

an organic light emitting diode including a diode output for emitting a broad spectrum light including a component of each primary color;

a multi-mode microcavity structure positioned to receive the broad spectrum light from the diode output and to cooperate with the organic light emitting diode defining an optical length of the microcavity structure to enhance the broad spectrum light to obtain multiple resonant peaks, one at each primary color, at a cavity output of the multi-mode microcavity structure; and a plurality of filters positioned adjacent the cavity output and integral with the organic electroluminescent device to receive and adjust the multiple resonant peaks to provide substantially balanced multiple resonant peaks.

2. A white light generating organic electroluminescent device as claimed in claim 1 wherein the plurality of filters includes a filter for each of the primary colors.

3. A white light generating organic electroluminescent device as claimed in claim 2 wherein the plurality of filters are inactive filters and each inactive filter includes a dimension adjusted to provide substantially balanced multiple resonant peaks.

4. A white light generating organic electroluminescent device as claimed in claim 3 wherein the dimension adjusted to provide substantially balanced multiple resonant peaks is a light receiving area.

5. A white light generating organic electroluminescent device as claimed in claim 2 wherein the plurality of filters are active filters with an adjustable electrical component and the adjustable electrical component of each filter is adjusted to provide substantially balanced multiple resonant peaks at a filter output.

6. A white light generating organic electroluminescent device as claimed in claim 1 wherein the optical length of the microcavity is approximately 1590 nm generating resonant peaks at approximately 636 nm, 530 nm and 454 nm.

7. A method of fabricating a white light generating organic electroluminescent device comprising the steps of:

fabricating an organic light emitting diode including a diode output for emitting a broad spectrum light including a component of each primary color;

positioning a multi-mode microcavity structure to receive the broad spectrum light from the diode output and to cooperate with the organic light emitting diode defining an optical length of the microcavity structure to enhance the broad spectrum light to obtain multiple resonant peaks, one at each primary color, at a cavity output of the multi-mode microcavity structure; and positioning a plurality of filters adjacent cavity output and integral with the organic electroluminescent device to receive and adjust the multiple resonant peaks to provide substantially balanced multiple resonant peaks.

8. A method as claimed in claim 7 wherein the step of positioning a microcavity structure includes the step of forming a microcavity with an optical length of approximately 1590 nm which generates resonant peaks at approximately 636 nm, 530 nm and 454 nm.

9. A method as claimed in claim 7 wherein the step of positioning a plurality of filters includes adjusting a dimension of each of the plurality of filters to adjust the multiple resonant peaks to provide substantially balanced multiple resonant peaks.

10. A method as claimed in claim 7 wherein the step of positioning a multi-mode microcavity includes forming a plurality of layers of material having different indexes of refraction such that the plurality of layers operates as a mirror stack, positioning the plurality of layers in spaced relationship from the diode output to reflect light from the diode output toward the organic light emitting diode and to cooperate with the organic light emitting diode to define an optical length of the microcavity, the plurality of layers further defining a microcavity output, and the optical length of the microcavity being such that light emitted from the microcavity output includes multiple resonant peaks, one at each primary color.

11. A method of generating substantially balanced multi-resonant peaks at each of the primary colors, comprising the steps of:

using an organic electroluminescent device, generating light containing components of each primary color;

enhancing the light to obtain multiple peaks, one at each primary color; and adjusting the multiple peaks by filtering the multiple peaks using a plurality of integrally formed color filters to provide substantially balanced multiple.

12. A method as claimed in claim 11 wherein the step of enhancing includes using a multi-mode microcavity structure.

* * * * *